United States Patent
Schwartz

(10) Patent No.: US 9,553,378 B2
(45) Date of Patent: Jan. 24, 2017

(54) ELECTRICAL CONNECTION UNIT BETWEEN TWO ELECTRONIC BOARDS

(71) Applicant: Valeo Equipements Electriques Moteur, Créteil (FR)

(72) Inventor: Christian Schwartz, Chatou (FR)

(73) Assignee: Valeo Equipements Electriques Moteur, Creteil (FR)

( * ) Notice: Subject to any disclaimer, the term of this patent is extended or adjusted under 35 U.S.C. 154(b) by 0 days.

(21) Appl. No.: 14/698,225

(22) Filed: Apr. 28, 2015

(65) Prior Publication Data
US 2015/0311608 A1    Oct. 29, 2015

(30) Foreign Application Priority Data
Apr. 29, 2014    (FR) ...................... 14 53886

(51) Int. Cl.
| | |
|---|---|
| H01R 12/00 | (2006.01) |
| H05K 1/00 | (2006.01) |
| H01R 12/52 | (2011.01) |
| H05K 3/36 | (2006.01) |
| H01R 12/58 | (2011.01) |
| H01R 12/70 | (2011.01) |
| H01R 12/71 | (2011.01) |
| H01R 12/91 | (2011.01) |
| H01R 13/22 | (2006.01) |
| H01R 13/73 | (2006.01) |

(52) U.S. Cl.
CPC ............ *H01R 12/52* (2013.01); *H01R 12/585* (2013.01); *H01R 12/7082* (2013.01); *H01R 12/714* (2013.01); *H01R 12/91* (2013.01); *H05K 3/36* (2013.01); *H01R 13/22* (2013.01); *H01R 13/73* (2013.01)

(58) Field of Classification Search
CPC ... H01R 12/52; H01R 12/585; H01R 12/7082; H01R 12/714; H01R 12/91; H01R 13/22; H01R 13/73; H05K 3/36
USPC ................... 439/65, 66, 83; 29/830
See application file for complete search history.

(56) References Cited

U.S. PATENT DOCUMENTS

| | | | | |
|---|---|---|---|---|
| 5,340,319 | A | * | 8/1994 | Enomoto ............ H01R 12/523 439/75 |
| 9,252,508 | B2 | * | 2/2016 | Endo ....................... H01R 9/00 |
| 2014/0030915 | A1 | | 1/2014 | Perrin |

FOREIGN PATENT DOCUMENTS

| | | |
|---|---|---|
| EP | 0582264 A1 | 2/1994 |
| EP | 2685566 A2 | 1/2014 |

\* cited by examiner

*Primary Examiner* — Javaid Nasri
(74) *Attorney, Agent, or Firm* — Osha Liang LLP

(57) ABSTRACT

An electrical connection unit for electrically interconnecting two electronic boards, is disclosed. The connection unit includes at least one electrical pin for electrically interconnecting the two boards, a mechanical link part for mechanically interlinking the two boards, where the electrical connection unit is disposed to enable concomitantly the electrical connection of the two boards via the pin and the mechanical link of the two boards via the link part, and a body which simultaneously carries the electrical pin and the mechanical link part, the body including a support portion for receiving and supporting one of the electronic boards, the support portion and the link part being disposed in such a way that the electronic board is held in place by being wedged between the support portion of the body and a point at which the mechanical link part is secured to the board.

15 Claims, 5 Drawing Sheets

ELECTRICAL CONNECTION UNIT BETWEEN TWO ELECTRONIC BOARDS

FIELD OF THE INVENTION

The present invention relates to an electrical connection unit between two electronic boards. The invention also relates to an electronic module including an electrical connection unit according to the invention.

BACKGROUND

An inverter is known for controlling an electric machine installed on-board a vehicle. An inverter of this type may include an electronic module having a housing; a power board including components through which the energy supplying the electric machine flows; and a control board including components to control the components of the power board.

The two boards may be positioned facing one another with an electrical link between them. Notably, a first board is positioned in a base of the housing; the second board is positioned above the first board by resting on one wall of the housing. The electrical link between the two boards can be established by electrical connection pins having each end soldered onto a board. However, the electronic module may be subjected to vibrations, due to the operation of the electric machine or its application in an automobile environment. These vibrations may weaken the soldered joints between the pins and the boards. One solution consists in attaching the power board onto a base of the housing and maintaining the control board to limit these vibrations, and thus preventing vibrations from accelerating the wear on the solder joints. However, the provision of the electrical connection and the holding of the boards may result in a plurality of steps which complicate the manufacture of the electronic module.

EP2685566A2 discloses an electric connector between two boards. This connector does not allow maintaining the board to limit vibrations.

The problem therefore arises of obtaining in a simple manner an electrical connection between two boards that is resistant to vibrations.

In order to solve this problem, the invention relates to an electrical connection unit intended to electrically interconnect two electronic boards, the connection unit including:
1. at least one electrical pin intended to electrically interconnect the two boards,
2. a mechanical link part to mechanically interlink the two boards,
3. the electrical connection unit being disposed to enable concomitantly the electrical connection of the two boards via the pin and the mechanical link of the two boards via the link part.

SUMMARY

In the context of the present application, an electronic board is understood to mean a support, such as a plate, enabling the holding and electrical interconnection of a set of electronic components, with the aim of performing an electronic function, in particular a complex electronic function.

By mechanically interlinking the two boards, a take-up of the stress between the two boards is obtained. The relative movements between the boards are limited, or even appreciably reduced. The electrical pin is not subjected to vibrations likely to damage the electrical connection between the pin and the boards.

According to the invention, the connection unit is disposed in such a way as to ensure concomitantly:
1. the electrical connection between the two boards by the pin; and
2. the mechanical connection between the two boards by the link part.

Due to the invention, by positioning the electrical connection unit on the two boards, the electrical conductor for the electrical connection between the two boards and the link part for the mechanical link between the boards are positioned at the same time. The assembly of the two boards together, or in a module including them, is simplified.

According to one embodiment, the unit comprises a body which simultaneously carries the electrical pin and said mechanical link part. Notably, the body carries only the electric pin(s) and the mechanical link part.

The fact of placing the pin and the link part on a common body simplifies the electrical connection and mechanical link operations between the two boards since the electrical connection and mechanical link elements can easily be manipulated together.

In particular, a portion of the body which keeps the pin and the mechanical link part together, or even the body in its entirety, may comprise a single holding part.

By taking hold of the body, an operator can therefore position the electrical pin and the mechanical link part on the two boards in a single action in order to obtain an electrical connection and a mechanical link between the boards.

The body is made, for example, from an electrically insulating material.

According to one variant, said body includes a portion, referred to as the support portion, intended to receive and support one of the electronic boards. In particular, the support portion and the link part of the body are disposed in such a way that the electronic board is held in place by being wedged 68 between the support portion of the body and a point via which the mechanical link part is secured to the board. The holding of the electronic board is thus improved.

According to one particular variant, the electrical pin and the link part extend in the same longitudinal direction. In particular, the support portion of the body extends transversely in relation to said direction.

According to one particular variant, the support portion of the body includes bulges 69, in particular spurs, intended to receive and support the board. These bulges 69 allow a space to be left between the surface of the board which faces the support portion and the surface of the support portion which is between the bulges 69. This is particularly advantageous when the electrical connection or the mechanical link with the board is implemented through soldering. Due to the space created by the bulges 69 between the board and the remainder of the support portion of the body, a meniscus can form during the soldering on either side of the board without the risk of the meniscus material spreading over the support portion. The occurrence of an electrical leak is thus avoided.

According to one embodiment, the link part is in the shape of a blade.

According to one embodiment, the link part includes two ends, each end being intended to be mechanically linked to one of the two boards.

According to one embodiment, the link part is intended to be mechanically linked to at least one of the boards through soldering. In particular, the link part is intended to be soldered to an electrical track of the electronic board; or to a metal part attached to the electronic board for this soldering. In particular, this metal part has no electrical function and serves only to solder the link part to the board.

According to one embodiment, the link part is intended to be mechanically linked to at least one of the boards through deformation, notably through twisting, of one end of the link part in an opening of the board. In particular, the end is intended to engage with an edge of said opening in order to be held in the opening. More particularly, the link part is sufficiently flexible so that its end can be turned on itself around its longitudinal axis.

According to one embodiment, the electrical pin has an end comprising a flexible, in particular S-shaped, foot, intended to abut with the surface of one of the boards. Due to the flexible foot, the pin can tolerate uncertainties in the assembly of the unit with the two boards.

According to one embodiment, the unit includes a plurality of pins. The pins may be arranged in two rows which extend, in particular, parallel to one another. Furthermore, the pins may be distributed on either side of the link part.

According to one embodiment, said link part and the pin extend longitudinally in one direction.

According to one embodiment, said body includes two parts extending mainly in a direction which is transverse to said longitudinal direction of the pin and the link part, said parts being such that:
1. a first part holds the pin and the link part in a first area of the pin and the link part;
2. a second part holds the pin and the link part in a second area of the pin and the link part;
3. the two parts being distant from one another in the longitudinal direction.

According to one variant, one of said parts of the body corresponds to said support portion intended to receive and support one of the electronic boards.

According to one variant, the body includes at least one longitudinal part linking the first and second parts of the body.

The invention is also related to an electrical connection unit intended to electrically interconnect two electronic boards, the connection unit including:
at least one electrical pin intended to electrically interconnect the two boards,
a mechanical link part to mechanically interlink the two boards, the electrical connection unit being disposed to enable concomitantly the electrical connection of the two boards via the pin and the mechanical link of the two boards via the link part
a body which simultaneously carries said electrical pin and said mechanical link part, said body including a portion, referred to as the support portion, intended to receive and support one of the electronic boards, the support portion and the link part being disposed in such a way that the electronic board is held in place by being wedged 68 between the support portion of the body and a point via which the mechanical link part is secured to the board.

This electrical connection unit may comprise one or many of the features previously described.

The invention furthermore relates to an electronic module including:
1. two electronic boards;
2. an electrical connection unit according to the invention which concomitantly electrically connects and mechanically links the two boards.

According to one embodiment, the link part is mechanically linked to at least one of the boards by means of a soldered joint. In particular, the link part is soldered to an electrical track of the electronic board; or to a metal part attached to the electronic board for this soldering. In particular, this metal part serves only to solder the link part to the board. Alternatively, this metal part has an electrical function, notably by serving as a link with the electrical earth of the electronic module.

According to one embodiment, the link part is mechanically linked to at least one of the boards through a deformation of one of its ends in an opening of the board. The end is, for example, twisted in the opening of the board. In particular, the deformed end of the link part engages with an edge of said opening in order to be held in the opening. The link part can be linked to a part attached to the electronic board for this mechanical link. In particular, this attached part serves only to provide the mechanical link between the link part and the board. Alternatively, this attached part has an electrical function, notably by serving as a link with the electrical earth of the electronic module.

For this purpose, the opening may have a large diameter and a small diameter. The mechanical link may be obtained by inserting the link part into the opening of the board with its largest transverse dimension parallel to the large diameter of the hole. The link part can then be twisted in order so that its largest transverse dimension moves in the direction of the small diameter of the hole. The link part thus abuts with the edges of the hole in order to be held therein.

According to one embodiment, a first board rests on a support, the mechanical link between the link part and the second board including a supporting of the second board on a portion, referred to as the support portion, of said support.

In particular, the support portion of the support and the link part are disposed in such a way that the second electronic board is held in place by being wedged 68 between the support portion of the support and a point via which the mechanical link part is secured to the board. The holding of the second electronic board in the module is thus improved. The vibrations of the second board are reduced.

The invention also relates to a method for the electrical interconnection of two electronic boards including the steps consisting in:
positioning an electrical connection unit according to the invention;
mounting the second board on the electrical unit, the pin of the electrical unit providing an electrical connection between the first and second board, and the link part of the electrical unit providing a mechanical link between the boards, in a concomitant manner.

BRIEF DESCRIPTION OF THE DRAWINGS

The invention will be better understood with reference to the drawings, in which:
1.

DETAILED DESCRIPTION OF THE DRAWINGS

Figure 1:
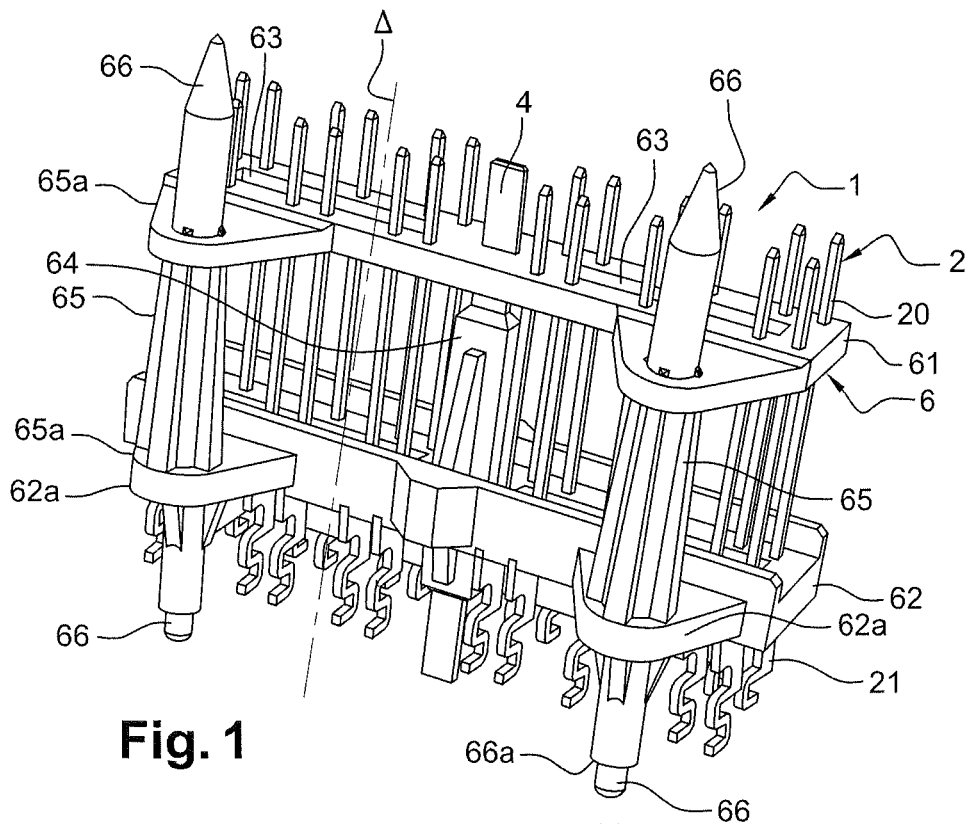
FIG. 1 shows an example of an electrical connection unit according to the invention;
2.
Figure 2:
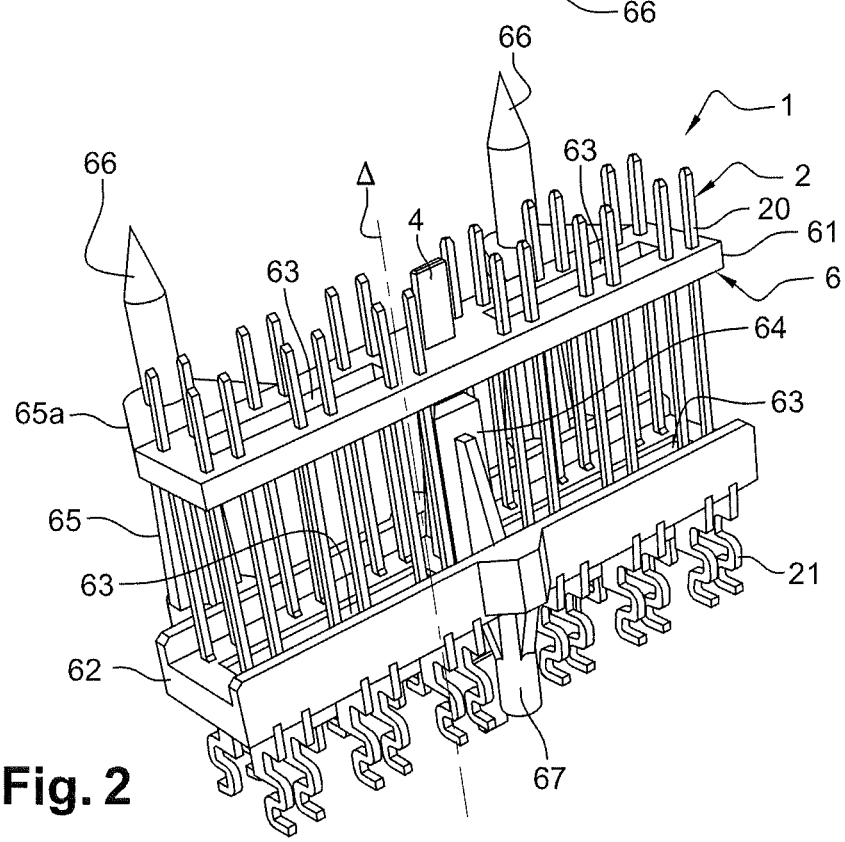
FIG. 2 shows a different view of the connection unit shown in FIG. 1;
3.
Figure 3:
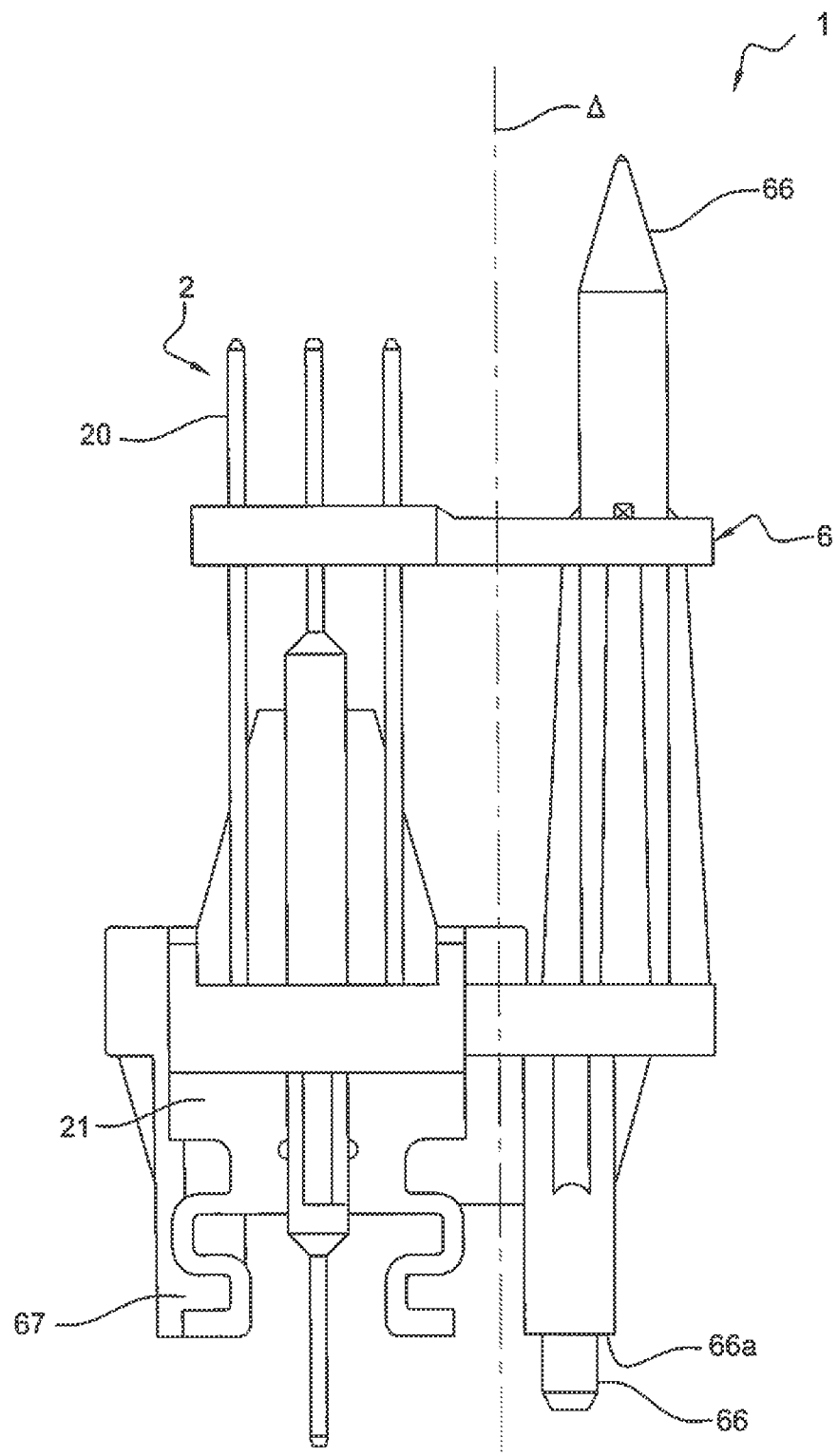
FIG. 3 shows a profile view of the connection unit shown in FIG. 1.

An example of an electrical connection unit according to the invention, which is intended to electrically connect two electronic boards, will be presented with reference to FIGS. 1 to 3

The electrical connection unit 1 includes a plurality of electrical pins 2 which are intended to electrically interconnect the two boards. Each pin 2 extends in a longitudinal direction Δ. The pin 2 notably includes a portion 20 in the shape of a bar and a flexible foot 21. In the example considered, the flexible foot 21 is more or less S-shaped.

A link part 4 serves to mechanically interlink the two boards. The link part 4 is in the shape of a blade and, for example, extends longitudinally in the same direction Δ as the pins 2. The pins 2 and the link part 4 are preferably made from materials having more or less the same coefficient of thermal expansion. For example, the pins 2 and the link part 4 are made from bronze, brass, copper, or a copper-iron alloy.

A body 6 simultaneously carries the electrical pins 2 and the mechanical link part 4. The body 6 holds the pins 2 and the link part 4 together. The pins 2, the link part 4 and the body 6 thus form a single element which can be manipulated in its entirety in order to be positioned in relation to the two boards. The body 6 is made from plastic, preferably a plastic that can tolerate being passed through a reflow oven. The connection unit 1 includes only the pins 2, the link part 4 and the body 6.

The body 6 includes a first and a second part 61, 62 which extend mainly in a direction transverse to the longitudinal direction Δ of the pins 2 and the link part 4. In particular, these first and second parts 61, 62 can be more or less parallelpiped-shaped. The first part 61 holds the pins 2 and the link part 4 in a first area of the latter, and the second part 62 holds them in a second area, the first and second areas being distant from one another in the longitudinal direction Δ. These two areas are preferably each close to a respective end of the pins 2 and the link part 4. The quantity of material used for the body 6 is thus limited, while allowing the pins 2 and the link part 4 to be held in position in relation to one another.

The second part 62 is notably in the area of the separation between the flexible foot 21 of a pin and the remainder of the pin 2. More particularly, the bar 20 has a smaller width than the flexible foot 21. Since the holes of the body 6 through which the pin 2 passes are adapted to the width of the bar 20, the flexible foot 21 cannot cross the body 6. This helps to hold the pin 2 in the body 6. Surface irregularities of the pin 2 which match irregularities on the internal walls of these holes of the body 6 can further improve the holding of the pin 2 in the body 6, by preventing one from sliding in relation to the other.

In order to further limit the quantity of material used for the body 6, each part 61, 62 of the body 6 may include hollow areas 63 in a zone which is free from the pins 2 and the link part 4.

The body 6 may furthermore include a sheath 64 which extends from the first part 61 or the second part 62 to cover an expanse of the link part 4 located between the first and second parts 61, 62. This sheath 64 improves the rigidity of the link part 4 in such a way as to limit the vibrations to which it could be subjected during a use of an assembly including the two boards fitted with the electrical connection unit 1. Ribs may run along the sheath 64 from the first part 61 or the second part 62 of the body 6 to add to the rigidity of the link part 4.

The body 6 includes one or more parts 65, referred to as the longitudinal parts, which link the first and second transverse parts 61, 62 of the body 6. The longitudinal part 65 extends mainly in the longitudinal direction Δ of the pins 2 and the link part 4. The longitudinal part 65 is preferably fixed to the first part 61 and the second part 62 in the area of a periphery of the latter. In the example shown in FIGS. 1 to 3, a plurality of longitudinal part 65 are fixed to the transverse parts 61, 62 in the area of the periphery of the parallelepiped-shaped parts 61, 62.

More particularly, for each longitudinal part 65, a projection 65a extends from the periphery of the first or the second part 61, 62.

The longitudinal part 65 includes a bar which extends from the projection 65a of the second transverse part 62 towards the projection 65a of the first transverse part 61. The bar of the transverse part 65 is integral with the projection of the second part 62 and engages with a hole crossing the projection 65a of the first part 61. Alternatively, the bar could be integral with the two projections 65a, or could engage with a hole in each projection 65a. The bar of the transverse part 65a may be made integral with the projections 65a by other equivalent means.

The body 6 includes guide pins 66 which will be inserted into matching holes of the boards in order to assist the arrangement of the electrical connection unit 1 with the electronic boards. These guide pins 66 are carried by the projections 65a. In particular, a guide pin 66 may be an extension of the bar of a longitudinal part 65.

The assembly of an example of an electrical connection unit with two boards will be explained with reference to FIGS. 4 to 6.

Figure 4:
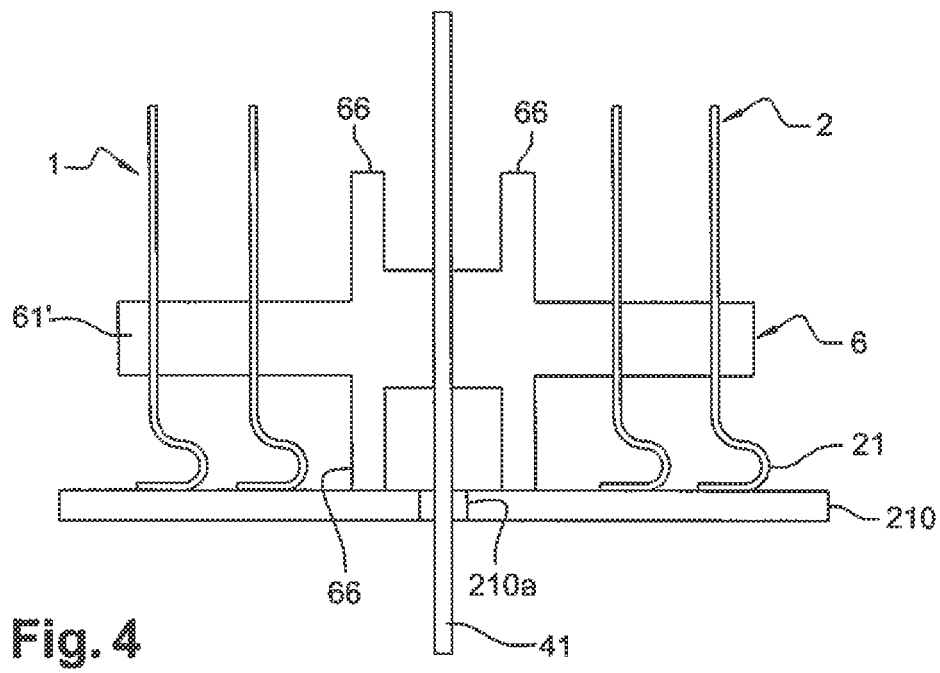
FIGS. 4 to 6 show steps of the assembly of an example of an electrical connection unit according to the invention with two boards.
Figure 5:
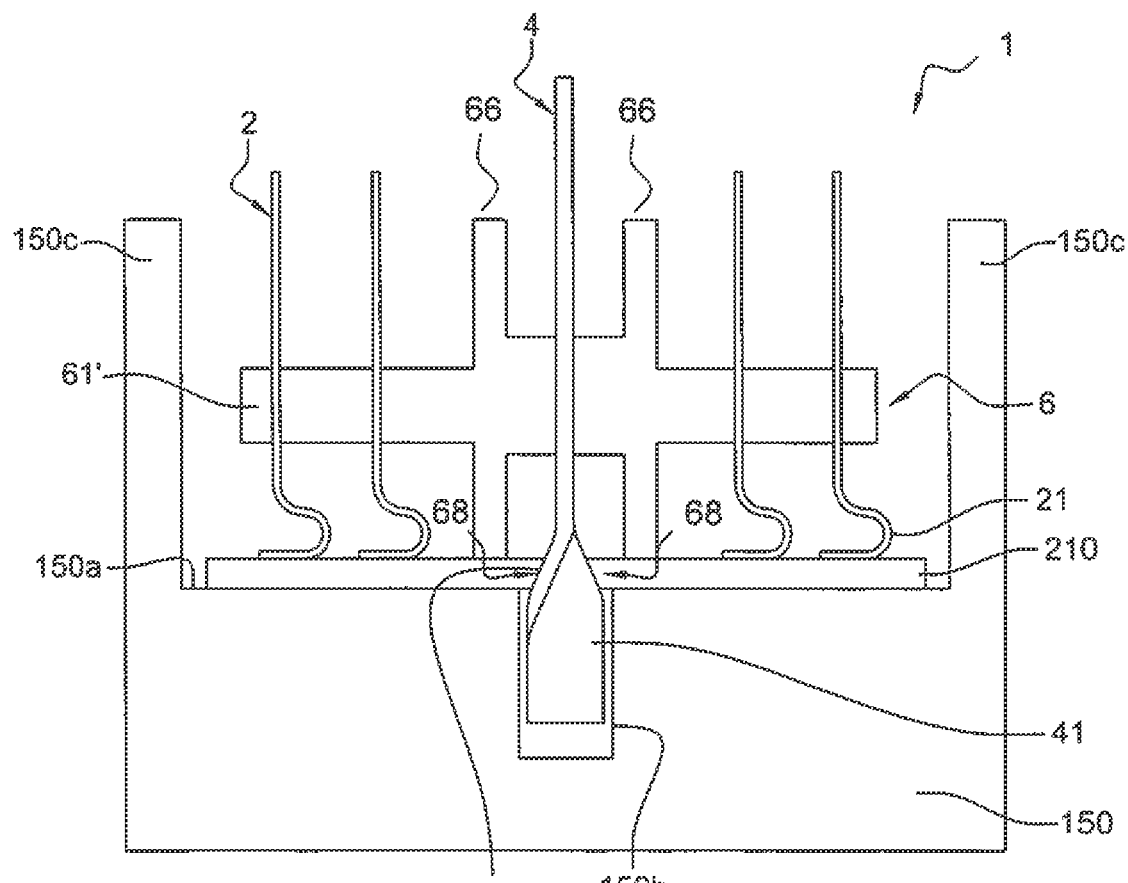
Figure 6:
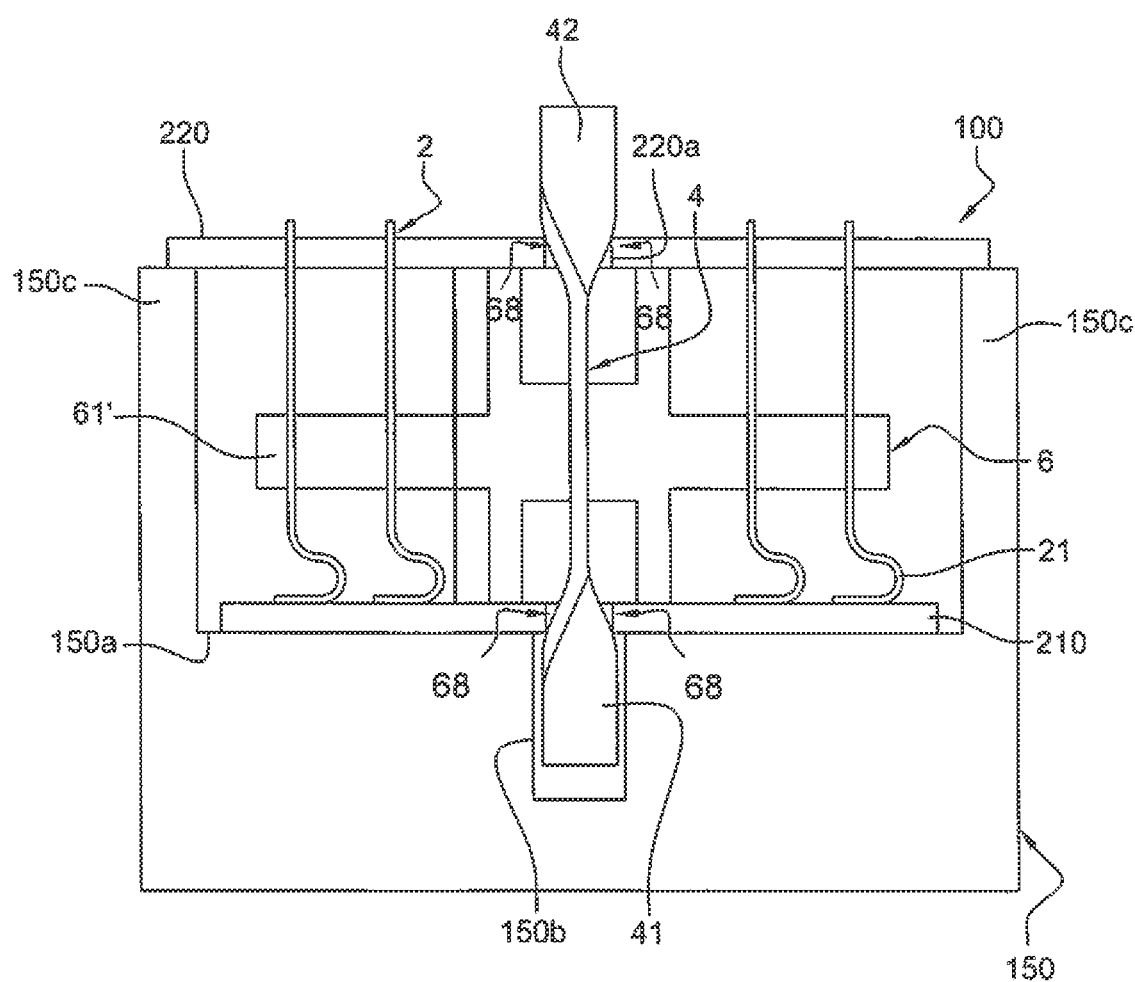

FIGS. 4 to 6 show a cross-section view of a different example of an electrical unit 1 in which the body 6 holds the pins 2 and the link part 4 by means of a single transverse part 61'. The transverse part 61' holds the pins 2 and the link part 4 in median zones of the latter, i.e. zones located between their ends. Furthermore, the flexible feet 21 of the pins 2 have a rounded shape which, in cross-section view, has more or less the shape of a single arc of a circle. As in the example shown in FIGS. 1 to 3, the body 6 includes pins 66 for the relative positioning of the electrical connection unit 1 with the electronic boards.

In FIG. 4, the connection unit 1 is positioned on a first board 210. The flexible feet 21 abut with a first surface of the board 210 in order to be soldered to the latter. For this purpose, the positioning of the connection unit 1 may be preceded by the deposition on the board 210 of a material at the places where the flexible feet 21 will be positioned in order to form soldered joints at a subsequent stage. The link part 4 has an end 41 which passes into an opening 210a of the first board 210 in order to extend beyond a second surface of the board 210 which is opposite the first surface.

As shown in FIG. 5, the end 41 of the link pert 4 which extends beyond the second surface of the first board 210 is twisted in such a way as to abut with an edge of the opening 210a of the first board 210 in order to be held in the opening. The first board 210 is thus held between the flexible feet 21 and the mechanical link point between the link part 4 and the board 210. The electrical connection unit 1 and the board 210 are therefore assembled.

In order to prevent excessive force from being exerted on the flexible feet 21, a lip 66a similar to that shown by the pins 66 in the example shown in FIGS. 1 to 3 can be provided on the pins 66. These lips 66a are supported against the surface of the boards 210. The first board 210 is thus held mainly between the lips 66*a* of the pins 66 and the mechanical link point between the link part 4 and the board 210.

Furthermore, in order to improve the stability of the electrical connection unit 1 on the first board 210, the body 6 may include a leg similar to the leg 67 in the example shown in FIGS. 1 to 3. The leg 67 is positioned in relation to the pins 66 which are intended to go into the first card 210 in such a way as to stabilise the holding of the connection unit 1 on the first board 210. In particular, the leg 67 is fixed to the transverse part 61', 62 in the area of a periphery of the latter. The leg 67 is positioned on one side which is opposite the side via which the pins 66 are fixed to the transverse part 61', 62. Each flexible foot 21 has a surface which comes into contact with the first surface of the board 210. These surfaces of the flexible feet 21 are more or less in the same plane. The leg 67 extends from its junction point with the body 6 towards this plane which more or less includes the surfaces of the flexible feet 21. The leg 67 is therefore supported against the surface of the first board 210. Thus, by having supports 66*a*, 67 on opposite sides of the transverse part 61', 62, it is ensured that the unit 1 is well stabilised. Stability is further improved if the leg 67 is equidistant from the two pins 66 of the transverse part 61', 62.

The flexible feet 21 are then soldered to the first electronic board 210. For this purpose, the assembly comprising the connection unit 1 and the first board 210 can be passed through a reflow oven. This assembly is then positioned in a housing 150 of an electronic module. Alternatively, the assembly comprising the connection unit 1 and the first board 210 may be positioned in the housing 150, then the entire assembly is passed through a reflow oven.

The first board 210 rests on a base 150*a* of the housing 150. The base 150*a* includes a hole 150*b* in which the twisted end 41 can be accommodated. The first board 210 may also rest entirely on the remainder of the base 150*a*.

Then, as shown in FIG. 6, the second board 220 is mounted on the electrical connection unit 1 and is supported against walls 150*c* which rise from the base 150*a* of the housing 150. The pins 2 pass through matching openings of the second board 220. The pins 66 assist with the relative positioning of the connection unit 1 and the second board 220. As with the first board 210, the link part 4 passes into a matching opening 220*a* of the second board 220 in order to extend beyond a second surface of the board 210 which is opposite a first surface via which the pins 2 and the link part 4 will be inserted into the second board 220.

As with the first board, the end 42 of the link part 4 which extends beyond the second surface of the second board 220 is twisted in such a way as to abut with an edge of the opening 220*a* of the second board 220 in order to be held in the opening. The second board 220 is thus held between the walls 150*a* of the housing 150 and the mechanical link point between the link part 4 and the second board 220. The electrical connection unit 1 and the second board 220 are therefore assembled.

The pins 2 are then soldered to the second electronic board 220. For this purpose, the assembly comprising the connection unit 1, the first board 210, the second board 220 and the housing 150 can be passed through a reflow oven.

An electronic module 100 is thus obtained, to which other elements can be added in order to obtain a required functionality, for example a DC/AC or DC/DC voltage converter functionality.

The invention is not limited to the examples described. In particular, the electrical connection unit 1 could include a single electrical pin 2. Conversely, the connection unit 1 could include a plurality of link parts 4. The pin 2 could have different ends. For example, the ends could be more or less identical, i.e. they could be two flexible feet 21 or two ends in the shape of a bar 20. The mechanical link between the link part 4 and the boards 210, 220 could be obtained by any other equivalent attachment means, for example by soldering.

Figure 7:
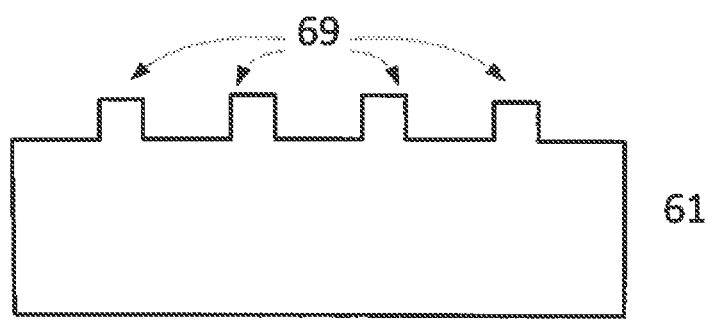
FIG. 7 shows an example of an electrical connection unit that includes bulges extending from the first part of a body.

In one embodiment, the examples of the connection unit 1 as shown in FIG. 7 could include bulges 69, in particular spurs, which would extend from the transverse part 61, 61' and on which the second board 220 can be supported. The transverse part 61, 61' then forms a support portion for the second board. The second board 220 would therefore engage between these spurs and the mechanical link point between the link part 4 and the second board 220. If a second board 220 has a dimension more or less equal to a transverse direction of the support part 61, 61', the second board 220 can then be held by the electrical connection unit 1 without furthermore being supported on the walls 150*b* of the housing 150.

The invention claimed is:

1. An electrical connection unit for electrically interconnecting two electronic boards, the connection unit comprising:
    at least one electrical pin electrically interconnecting the two boards;
    a mechanical link part to mechanically interlink the two boards, the electrical connection unit being disposed to enable concomitantly the electrical connection of the two boards via the pin and the mechanical link of the two boards via the link part; and
    a body which simultaneously carries said electrical pin and said mechanical link part, said body having a support portion configured to receive and support one of the electronic boards,
    the support portion and the link part being disposed in such a way that the electronic board is held in place by being wedged between the support portion of the body and a point at which the mechanical link part is secured to the board,
    wherein the link part is intended to be mechanically linked to at least one of the boards through a twisting deformation of one end of the link part in an opening of the board.

2. The unit according to claim 1, wherein said support portion configured to receive and support one of the boards includes bulges for receiving and supporting the board.

3. The unit according to claim 1, wherein said link part is in the shape of a blade.

4. The unit according to claim 1, wherein the link part includes two ends, each end being mechanically connected to one of the two boards.

5. The unit according to claim 1, wherein the link part is intended to be mechanically linked to at least one of the boards by means of soldering.

6. A method for the electrical interconnection of two electronic boards, comprising positioning the electrical connection unit as claimed in claim 1 on a first board of the two boards; and
    mounting a second board of the two boards on the electrical unit, the pin of the electrical unit providing an electrical connection between the first board and second board, and the link part of the electrical unit establishing a mechanical link between the boards, in a concomitant manner.

7. The unit according to claim 1, wherein the electrical pin has an end comprising a flexible foot which abuts with the surface of one of the boards.

8. The unit according to claim 1, further comprising a plurality of pins.

9. The unit according to claim 1, wherein said link part and the pin extend longitudinally in a direction.

10. The unit according to claim 9, wherein said body includes two parts extending mainly in a direction which is transverse to the longitudinal direction of the pin and the link part, wherein:
- a first part of the two parts holds the pin and the link part in a first area of the pin and the link part;
- a second part of the two parts holds the pin and the link part in a second area of the pin and the link part;
- the two parts being distant from one another according to the longitudinal direction of the pin and the link part.

11. The unit according to claim 10, wherein the body includes at least a longitudinal part linking the first part and the second part of the body.

12. An electronic module including:
- two electronic boards;
- the electrical connection unit according to claim 1, which concomitantly electrically connects and mechanically links the two boards.

13. A module according to claim 12, wherein the link part is mechanically linked to at least one of the boards by a soldered joint.

14. The module according to claim 12, wherein the link part is mechanically linked to at least one of the boards by an end which is deformed by twisting, in an opening of the board to engage with an edge of said opening.

15. The module according to claim 12, wherein a first board of the two boards rests on the support, the mechanical link between the mechanical link part and a second board of the two boards including a supporting of the second board on a portion of said support.

* * * * *